United States Patent
Chang et al.

(10) Patent No.: US 11,443,667 B2
(45) Date of Patent: Sep. 13, 2022

(54) DISPLAY APPARATUS AND DATA DRIVING INTEGRATED CIRCUIT THEREOF

(71) Applicant: Novatek Microelectronics Corp., Hsinchu (TW)

(72) Inventors: Chang-Pao Chang, Hsinchu (TW); Wei-Da Guo, Hsinchu (TW); Yueh-Hsun Tsai, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 14 days.

(21) Appl. No.: 16/419,018

(22) Filed: May 22, 2019

(65) Prior Publication Data

US 2019/0362665 A1    Nov. 28, 2019

Related U.S. Application Data

(60) Provisional application No. 62/674,632, filed on May 22, 2018.

(51) Int. Cl.
*H01L 27/02* (2006.01)
*H01L 23/60* (2006.01)
(Continued)

(52) U.S. Cl.
CPC .............. *G09G 3/20* (2013.01); *H01L 23/60* (2013.01); *H01L 27/0296* (2013.01);
(Continued)

(58) Field of Classification Search
CPC ............. G09G 3/20; G09G 2300/0426; G09G 2310/0275; G09G 2330/021;
(Continued)

(56) References Cited

U.S. PATENT DOCUMENTS 5,671,026 A * 9/1997 Shiraki ............. G02F 1/136204
349/40
8,976,300 B2    3/2015 Zhu
(Continued)

FOREIGN PATENT DOCUMENTS

| CN | 104238224 | 12/2014 |
| CN | 204340669 | 5/2015 |

(Continued)

OTHER PUBLICATIONS

"Office Action of Taiwan Counterpart Application", dated Apr. 9, 2020, pp. 1-5.

*Primary Examiner* — Douglas M Wilson
(74) *Attorney, Agent, or Firm* — JCIPRNET (57) ABSTRACT

The disclosure provides a display apparatus and a data driving integrated circuit thereof for removing the interference patterns caused by radio wave interference. In the disclosure, a data driving integrated circuit includes a gamma voltage generating circuit, power terminals for receiving power voltages of the gamma voltage generating circuit. The data driving integrated circuit couples dummy terminals to the power terminals, so as to decrease the equivalent impedance of the power terminals through a parallel connection between the I/O ESD protection circuits. Therefore, the DC offset of the power voltages caused by the radio wave interference may be decreased.

13 Claims, 8 Drawing Sheets

(51) Int. Cl.
*H05K 1/02* (2006.01)
*G09G 3/36* (2006.01)
*G09G 3/20* (2006.01)

(52) U.S. Cl.
CPC ... *G09G 3/3696* (2013.01); *G09G 2300/0426* (2013.01); *G09G 2310/027* (2013.01); *G09G 2310/0275* (2013.01); *G09G 2320/0204* (2013.01); *G09G 2330/021* (2013.01); *G09G 2330/028* (2013.01); *G09G 2330/04* (2013.01); *G09G 2330/06* (2013.01); *H01L 27/0248* (2013.01); *H01L 27/0255* (2013.01); *H01L 27/0292* (2013.01); *H05K 1/0259* (2013.01)

(58) Field of Classification Search
CPC ....... G09G 2320/0204; G09G 2330/04; G09G 3/3696; G09G 2330/028; G09G 2330/06; G09G 2310/027; H01L 27/0296; H01L 23/60; H01L 27/0255; H01L 27/0248; H01L 27/0292; H05K 1/0259
See application file for complete search history.

(56) References Cited

U.S. PATENT DOCUMENTS

| | | |
|---|---|---|
| 9,190,403 B2 | 11/2015 | Huang et al. |
| 9,542,879 B2 | 1/2017 | Huang et al. |
| 9,910,547 B2 | 3/2018 | Lee et al. |
| 2004/0190208 A1* | 9/2004 | Levit .............. H01L 23/60 361/56 |
| 2005/0274990 A1* | 12/2005 | Wu .............. H01L 27/0292 257/232 |
| 2009/0303225 A1* | 12/2009 | Kang ............ G09G 3/3688 345/87 |
| 2010/0007596 A1* | 1/2010 | Cho .............. G09G 3/20 345/98 |
| 2010/0308472 A1* | 12/2010 | Jung ............ H01L 23/60 257/E23.153 |
| 2011/0057923 A1* | 3/2011 | Yuki ............ G09G 3/3685 345/212 |
| 2011/0110004 A1* | 5/2011 | Maier ............ H01L 23/60 361/56 |
| 2013/0127795 A1 | 5/2013 | Hsu et al. |
| 2013/0208385 A1* | 8/2013 | Salcedo ........ H01L 23/60 361/111 |
| 2014/0307174 A1 | 10/2014 | Zhu |
| 2014/0361301 A1 | 12/2014 | Huang et al. |
| 2016/0042683 A1 | 2/2016 | Huang et al. |
| 2016/0291835 A1 | 10/2016 | Leng |
| 2017/0171366 A1 | 6/2017 | Liu et al. |
| 2018/0090083 A1* | 3/2018 | Kim ............ G09G 3/3688 |
| 2019/0228730 A1* | 7/2019 | Cong ............ G09G 3/006 |

FOREIGN PATENT DOCUMENTS

| | | |
|---|---|---|
| JP | 2013113916 | 6/2013 |
| TW | 201322230 | 6/2013 |
| TW | 201521006 | 6/2015 |
| WO | 2018037335 | 3/2018 |

\* cited by examiner

DISPLAY APPARATUS AND DATA DRIVING INTEGRATED CIRCUIT THEREOF

CROSS-REFERENCE TO RELATED APPLICATION

This application claims the priority benefits of U.S. provisional application Ser. No. 62/674,632, filed on May 22, 2018. The entirety of the above-mentioned patent applications is hereby incorporated by reference herein and made a part of this specification.

BACKGROUND OF THE INVENTION

Field of the Invention

The invention is related to a data driving integrated circuit of a display apparatus, and particularly, a data driving integrated circuit that prevents displaying images from high-frequency interference on a display apparatus.

Description of Related Art

Displaying images on a screen of a laptop or desktop computer are often interfered by a mobile phone nearby the screen which has an ongoing radio communication in radio frequency bands, and one may see images with interference patterns, like ripples or waves on the screen. The interference refers to influence of the radio wave emitted by the mobile phone to the electrical signals of a data driving integrated circuit (may also be referred to as data driver) of the screen of the laptop or desktop computer.

For example, under Time-division multiple access (TDMA) scheme of Global System for Mobile Communications (GSM), a TDMA frame (4.615 ms) consists of 8 time slots respectively for 8 users and the frequency of a radio communication signal, which is a pulse signal, is 216.7 Hz. Each pulse carries a high frequency sinusoidal signal, such as a 980 MHz sinusoidal signal. It is found that the interference patterns like ripples or waves may be resulted from the radio communication signal, since a standby mobile phone without any TDMA communication link which is nearby the screen does not influence the screen displaying.

SUMMARY OF THE INVENTION

The disclosure introduces a display apparatus and a data driving integrated circuit thereof for decreasing the DC offset by connecting power terminal with dummy terminals, so as to remove the interference patterns that superimposes with a displayed image on the display apparatus.

The disclosure provides a display apparatus includes a display panel, a data driving integrated circuit, a power supplying circuit, and a connecting device. The display panel includes a plurality of pixels, wherein each pixel is driven according to a data voltage. The data driving integrated circuit is disposed on a substrate which is a part of the display panel, for providing data voltages to drive the pixels. The data driving integrated circuit includes a gamma voltage generating circuit, a first power terminal, a first ESD protection circuit, a second power terminal, a first dummy terminal, and a second ESD protection circuit. The gamma voltage generating circuit is configured to receive a first voltage through the first terminal and a second voltage through the second terminal, where the first voltage and the second voltage are in a gamma voltage range, or are as the largest and the smallest gamma voltages of the gamma voltage range. The first ESD protection circuit associated with the first power terminal, and the second ESD protection circuit associated with the first dummy terminal. The first dummy terminal is coupled to the first terminal, and the first ESD protection circuit and the second ESD protection circuit are coupled in parallel. The power supplying circuit is disposed on a mainboard and configured to generate the first voltage and the second voltage. In addition, the connecting device connects the mainboard and the data driving integrated circuit, where the first voltage and the second voltage are transmitted to the data driving integrated circuit through the connecting device.

To make the above features and advantages of the present disclosure more comprehensible, several embodiments accompanied with drawings are described in detail as follows.

It may be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" "an" entity refers to one or more of that entity. As such, the terms "a" (or "an"), "one or more" and "at least one" can be used interchangeably herein.

It is found that the interference patterns like ripples or waves on the screen is resulted from the mobile phone (nearby the screen) having an ongoing TDMA communication link. This is because the radio frequency interference may show as fluctuation in at least one gamma reference voltage transmitted to a data driving integrated circuit of the screen, and an ESD protection circuit (in the data driving integrated circuit) associated with an I/O pin configured to receive the gamma reference voltage, which act as an non-ideal diode, may result in a DC offset in the gamma reference voltage. Due to the gamma reference voltage with undesired DC offset, gamma voltages which pixel voltages are selected from are also affected, and as a result one may see the interference pattern in displayed images. In the exemplary embodiments of the disclosure, for the data driving integrated circuit, at least one I/O pin configured to receive a gamma reference voltage couples to at least one dummy I/O pin, so that the ESD protection circuit of each of the I/O pins are being connected in parallel. The parallel connection of the ESD protection circuits would have smaller equivalent impedance and decrease the DC offset in the gamma reference voltage. Dummy I/O pins may be reserved I/O pins.

Figure 1:
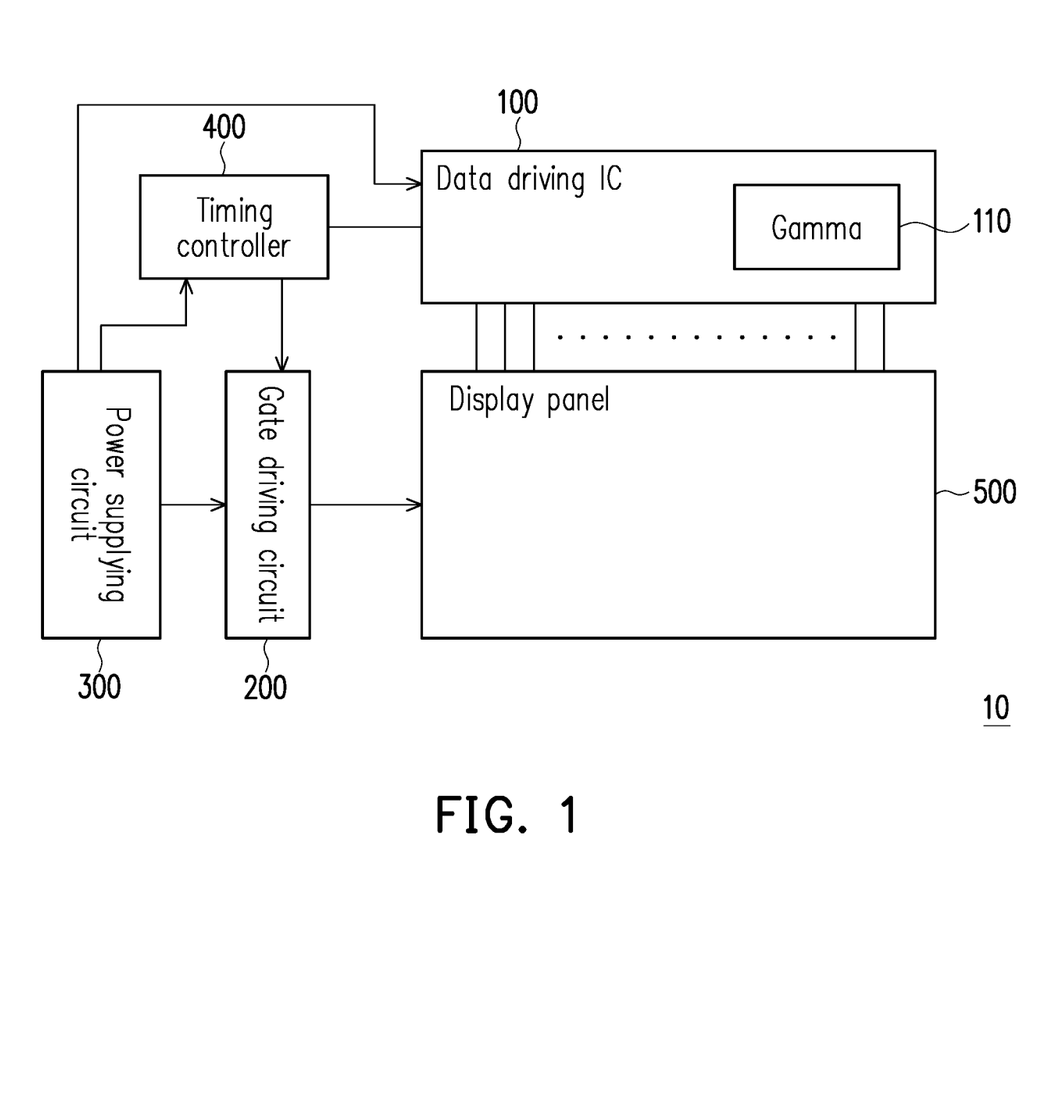
FIG. 1 is a block diagram illustrating a circuitry of a display apparatus according to an exemplary embodiment of the disclosure.

FIG. 1 is a block diagram illustrating a circuitry of a display apparatus 10 according to an exemplary embodiment of the disclosure. The display apparatus 10 includes a data driving integrated circuit (IC) 100, a gate driving circuit 200, a power supplying circuit 300, a timing controller 400, and a display panel 500. The data driving integrated circuit 100 is configured to output data voltage to each pixel of the display panel 500. The gate driving circuit 200 is configured to output gate control signal to each pixel of the display panel 500. The power supplying circuit 300 is configured to provide voltages to the data driving integrated circuit 100, the gate driving integrated circuit 200, and the timing controller 400. The timing controller 400 is configured to receive display data from an image processor and control the data driving integrated circuit. 100 and the gate riving circuit 200 for displaying an image corresponding to the display data on the display panel 500. The display panel 500 includes a plurality of pixel units arranged at intersections between a plurality of data lines and a plurality of scan lines in a matrix form.

The exemplary embodiment is not intended to limit the number of the data driving integrated circuit 100 and the number of the gate driving circuit 200. In some exemplary embodiments of the disclosure, the data driving integrated circuit 100 may include a plurality of data driving ICs that provide data voltage for different section of the display panel 500. The gate driving circuit 200 may include a plurality of gate driving circuits that provides gate control signal to different section of the display panel 500. In some exemplary embodiments, the data driving IC 100 may include a first data driving IC for driving pixels arranged in the odd columns and a second data driving IC for driving pixels arranged in the even columns.

Figure 2:
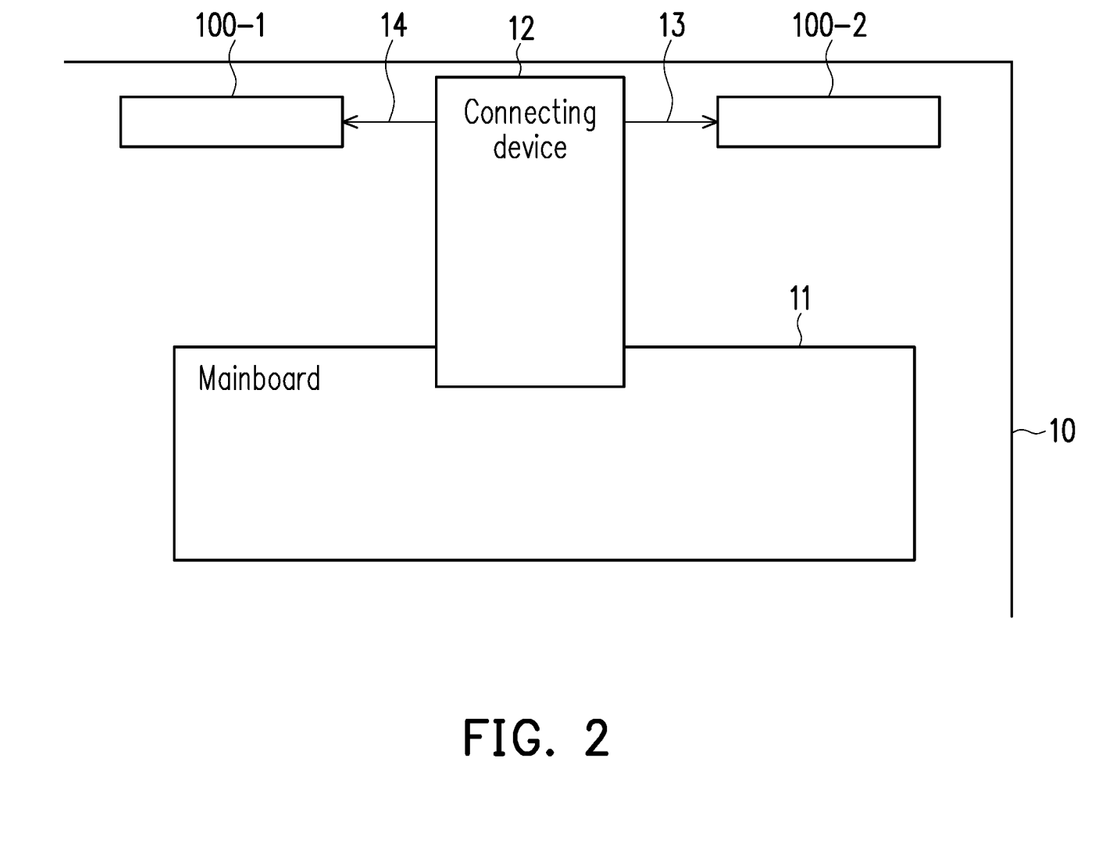
FIG. 2 is a block diagram illustrating circuitry of a portion of a display apparatus according to an exemplary embodiment of the disclosure.

FIG. 2 is a block diagram illustrating circuitry of a portion of a display apparatus according to an exemplary embodiment of the disclosure. With reference to FIG. 2, the display apparatus includes a mainboard 11, a connecting device 12, and data driving ICs 100-1, 100-2. The mainhoard 11 may be a printed circuit board (PCB) that includes circuitry that forms the power supplying circuit 300, the timing controller 400, etc. The connecting device 12 may be flexible printed circuit (FPC) or flexible flat cable (FFC). The connecting device 12 includes a plurality of cables or traces which are configured to transmit electrical signals or power voltages between the mainboard 11 and the data driving ICs 100-1, 100-2. In the exemplary embodiment, the data driving ICs 100-1, 100-2 are formed on a substrate or a glass substrate of the display panel 10. However, the exemplary embodiment is not intended to limited the implementation of the data driving IC s 100-1, 100-2.

A timing controller (not shown) disposed on the mainboard 11 of the display apparatus 10 provides display data and a power supplying circuit (not shown) disposed on the mainboard 11 provides gamma reference voltages. The display data signal and gamma reference voltages are then transmitted to the data driving ICs 100-1, 100-2 through the connecting device 12 and traces 13, 14 on the substrate. Due to the physical distance between the mainboard 11 and the data driving ICs 100-1, 100-2, the display data signal and the gamma reference voltages therebetween are vulnerable to the radio frequency interferences.

Figure 3:
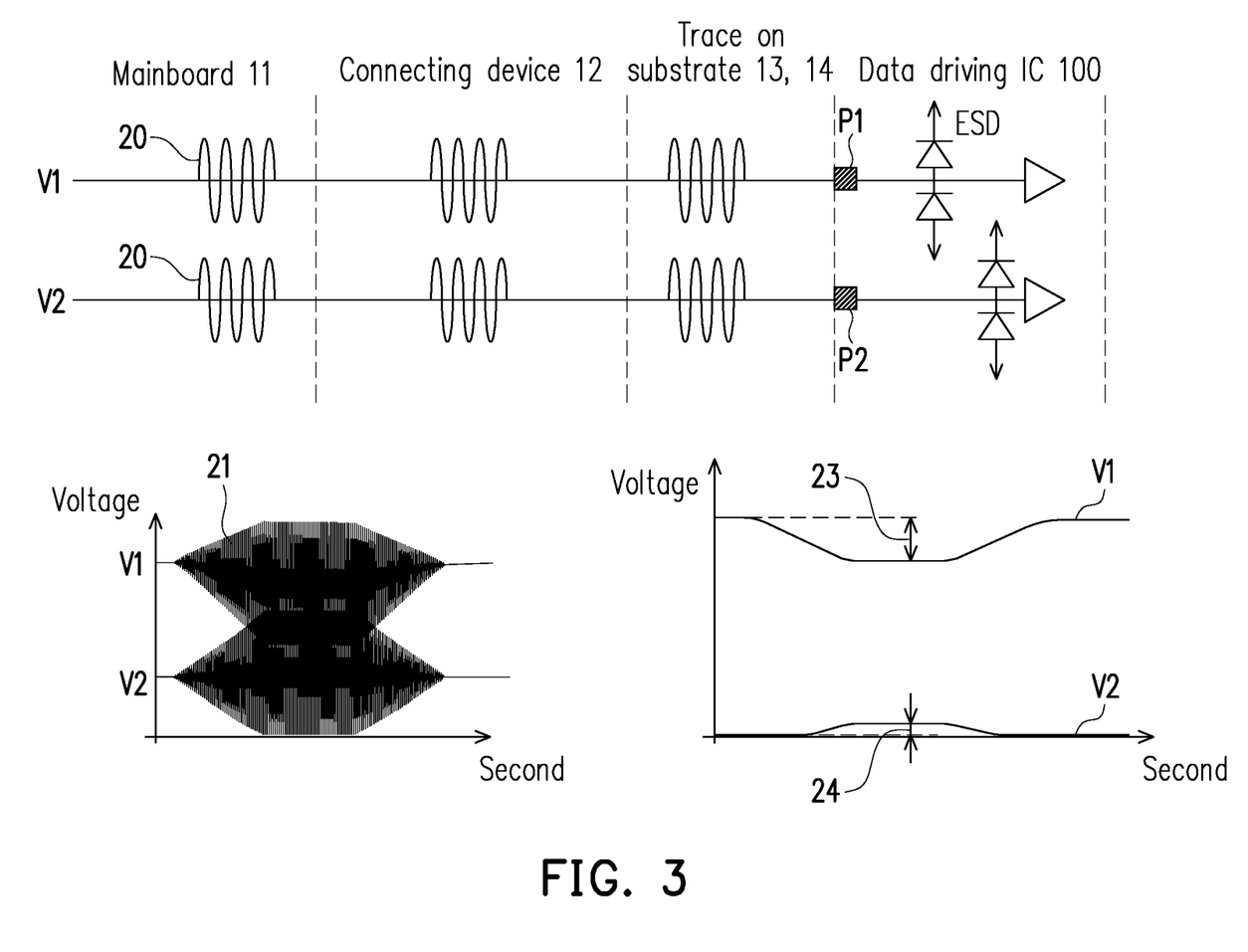
FIG. 3 is a diagram illustrating signal paths between the mainboard and the data driving IC according to an exemplary embodiment of the disclosure.

FIG. 3 is a diagram illustrating signal paths between the mainboard 11 and the data driving IC 100-1, 100-2 according to an exemplary embodiment of the disclosure. In the exemplary embodiments, gamma reference voltages, including a first voltage V1 and a second voltage V2, are transmitted from the mainboard 11 to the data driving IC 100. With reference to FIG. 3, due to the radio frequency interference, fluctuations 21 in the first and second voltages V1, V2 may occur at mainboard 11, connecting device 12, and trace 13, 14 between the connecting device 12 and the data driving IC 100. When the first and second voltages V1, V2 are received through a first power voltage pin P1 and a second power voltage pin P2 of the data driving IC 100, the ESD protection circuits respectively coupled to the first and second power voltage pins may act as capacitor and filter the fluctuation and results in a DC offset 23 at the first voltage V1 and a DC offset 24 at the second voltage V2. For example, the power supplying circuit disposed on the mainboard may transmit the first voltage V1 having 9.5V and the second voltage V2 having 0.3V. The ESD protection circuits may cause a DC offset of 1.85V in the first voltage V1 and a DC offset of 0.49V in the second voltage V2. Since the first and second voltages V1, V2 are utilized as gamma reference voltages for generating gamma voltages, these DC offsets would affect the gamma voltages, which results in the interference patterns shown in the displayed image on the display panel.

Figure 4:
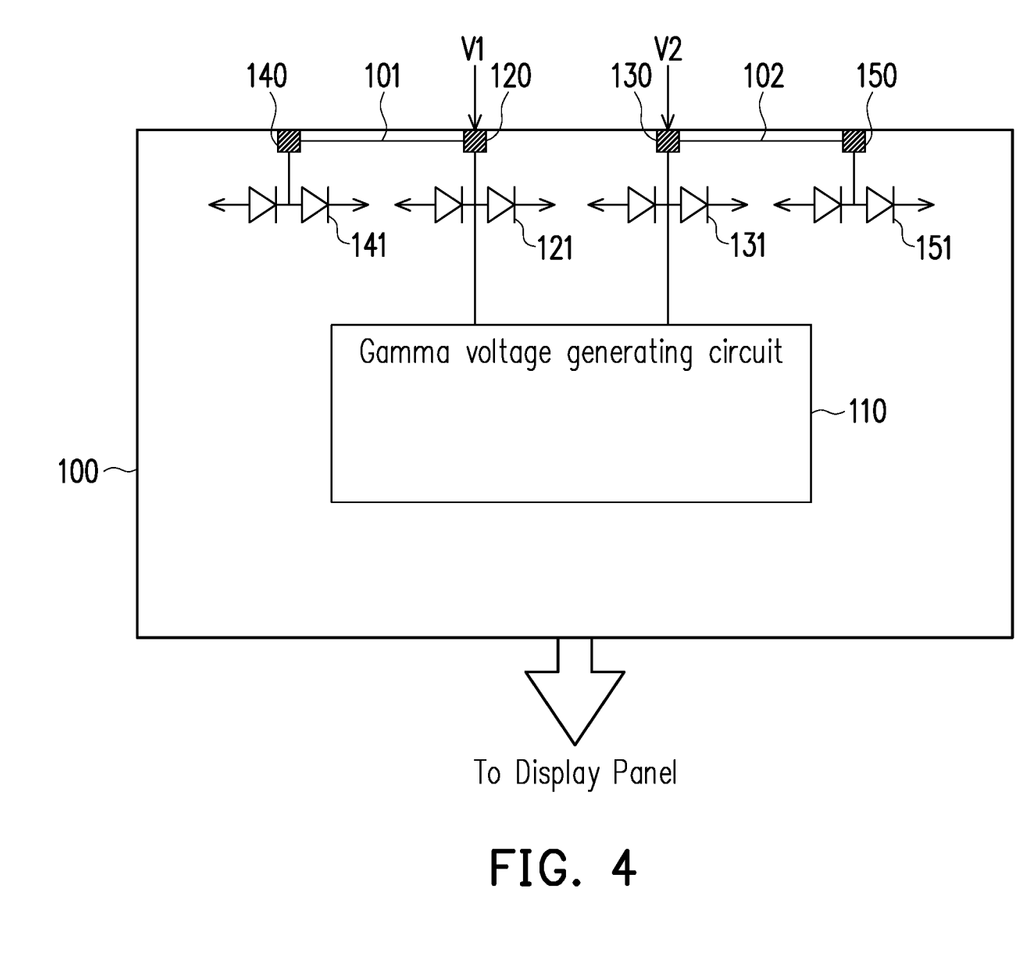
FIG. 4 is a block diagram illustrating a portion of a data driving IC according to an exemplary embodiment of the disclosure.

FIG. 4 is a block diagram illustrating a portion of a data driving IC according to an exemplary embodiment of the disclosure. The data driving IC 100 includes the gamma voltage generating circuit 110, a first power terminal 120, a second power terminal 130, a first dummy terminal 140, and a second dummy terminal 150, a first ESD protection circuit 121, a second ESD protection circuit 131, a third ESD protection circuit 141, and a fourth ESD protection circuit 151. The first power terminal 120 and the second power terminal 130 are pins configured to receive gamma reference voltages, and the first dummy terminal 140 and the second dummy terminal 150 may be pins reserved for receiving other gamma reference voltages or merely pins without any function. The first power terminal 120 is coupled to the first ESD protection circuit 121. The second power terminal 130 is coupled to the second ESD protection circuit 131. The first dummy terminal 140 is coupled to the third ESD protection circuit 141. The second dummy terminal 150 is coupled to the fourth ESD protection circuit 151. The first power terminal 120 is coupled to the gamma voltage generating circuit 110 with the first ESD protection circuit 121 therebetween. The first power terminal 120 is configured to receive a first voltage V1 from the power supplying circuit 300 and couple the first voltage V1 to the gamma voltage generating circuit 300. The second power terminal 130 is coupled to the gamma voltage generating circuit 110 with the second ESD protection circuit 131 being coupled therebetween. The second power terminal 130 is configured to receive a second voltage V2 from the power supplying circuit 300 and couple the second voltage V2 to the gamma voltage generating circuit 110. The gamma voltage generating circuit 110 generates a plurality of gamma voltages based on the received first and second voltages V1, V2 such that pixel voltages for driving the display panel can be selected from the gamma voltages. The first and second voltages define a range of gamma voltage of which the gamma voltage generating circuit 110 may generate.

Figure 5:
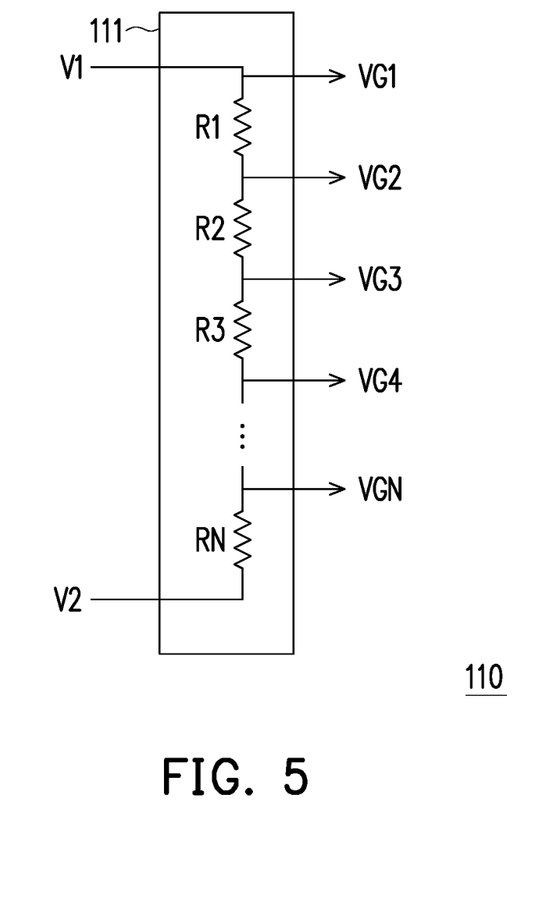
FIG. 5 is a diagram illustrating voltage dividing circuits of a gamma voltage generating circuit according to an exemplary embodiment of the disclosure.

FIG. 5 is a diagram illustrating voltage dividing circuits of a gamma voltage generating circuit according to an exemplary embodiment of the disclosure. The gamma voltage generating circuit 110 includes a plurality of resistors R1, R2, R3 . . . RN forming one or more voltage dividing circuits 111, where the first voltage V1 is coupled to one end of the voltage dividing circuit 111 and the second voltage V2 coupled to another end of the voltage dividing circuit 111. The voltage dividing circuits 111 uses the gamma voltage range defined by the first and second voltages V1, V2 to generate a plurality of gamma voltages VG1, VG2, VG3, VG4 . . . VGN. In the present embodiment, the first and second voltages V1, V2 are used as maximum and minimum voltages (VG1 and VGN) of the voltage dividing circuit 111.

Although the exemplary embodiment uses two voltages as reference voltages for generating the gamma voltages, the disclosure is not intended to limit thereto. In other exemplary embodiments, a third voltage or more voltages may be provided by the power supplying circuit 300 on the mainboard 11 as additional reference voltages for generating gamma voltage, hence the first voltage V1 and the second voltage V2 may be intermediate gamma reference voltages in the gamma voltage range, such as V4 or VG(N−1). For example, the first voltage may be 1V, the second voltage may be 10V, the third voltage may be 5V, and a fourth voltage may be 7V. The gamma voltages may be generated using these reference voltages.

Referring back to FIG. 4, the first power terminal 120 is coupled to a first dummy terminal 140 forming a (direct) connection 101, and the second power terminal 130 is coupled to a second dummy terminal 150 forming a (direct) connection 102. The first and second dummy terminals 140, 150 are I/O pins reserved for receiving gamma reference voltages. The first dummy terminal 140 may be immediately adjacent to the first power terminal 120. The second dummy terminal 150 may be immediately adjacent to the second power terminal 130.

The first power terminal 120 and the first dummy terminal 140 connecting together makes the first ESD protection circuit 121 and the second ESD protection circuit 141 connecting in parallel. The second power terminal 130 and the second dummy terminal 150 connecting together makes the third ESD protection circuit 131 and the fourth ESD protection circuit 151 connecting in parallel. The parallel connection of the ESD protection circuits decreases the equivalent impedance at 1 GHz at the first and second power terminals 120, 130, and thus decreases 1 GHz radio frequency interference cross the ESD protection circuits. Benefit from the 1 GHz radio frequency interference cross the ESD protection circuits decreasing, the DC offsets in the gamma reference voltages received through the first and second power terminals 120, 130 also decrease, such as shown in FIG. 3.

In the exemplary embodiment, the connection 101 between the first power terminal 120 and the first dummy terminal 140 and the connection 102 between the second power terminal 130 and the second dummy terminal 150 may be formed by a conductive layer, such as one of metal layers of the data driving integrated circuit.

Figure 6:
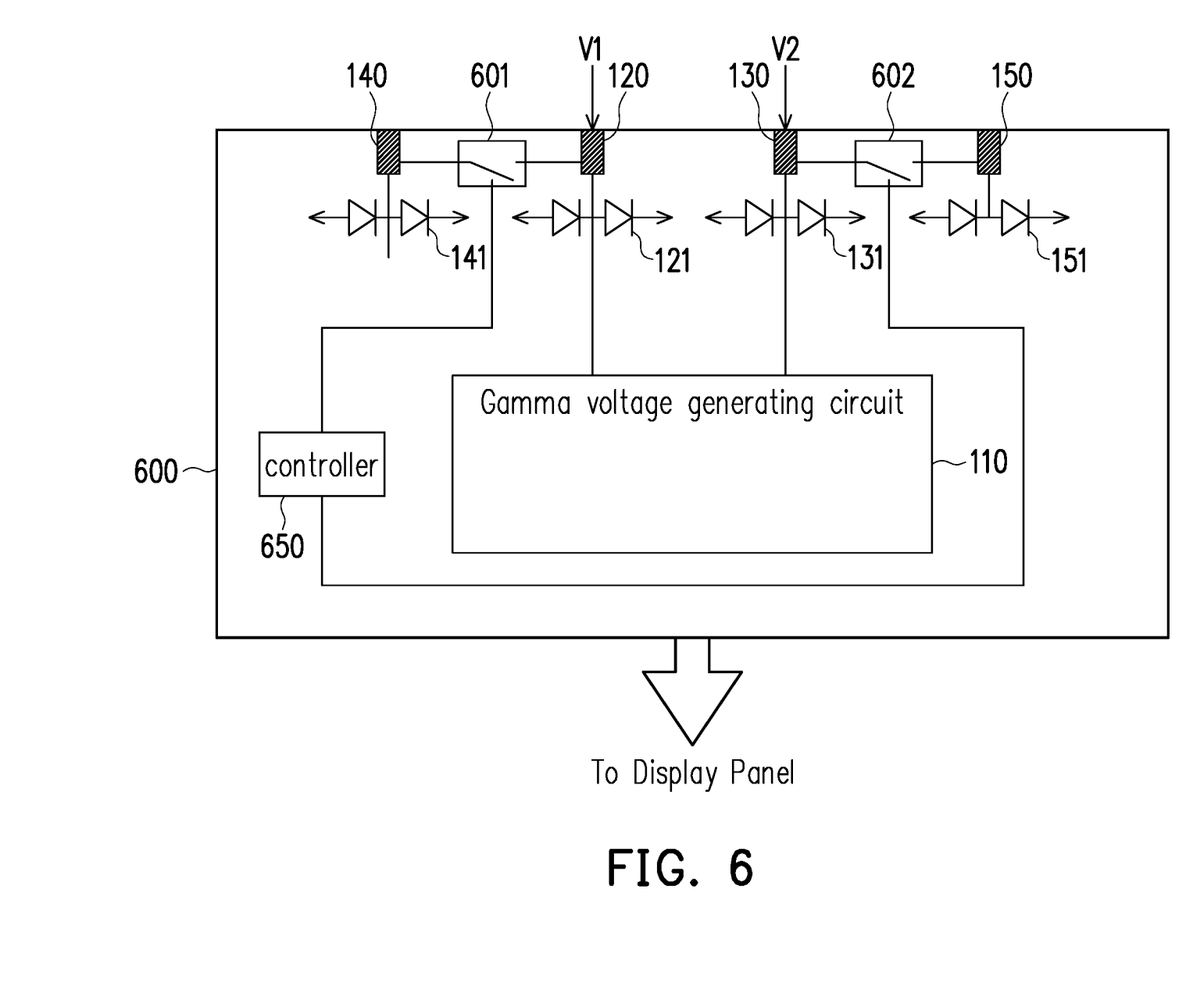
FIG. 6 is a diagram illustrating a data driving IC according to an exemplary embodiment of the disclosure.

In some exemplary embodiments, the connection 101 between the first power terminal 120 and the first dummy terminal 140 and the connection 102 between the second power terminal 130 and the second dummy terminal 150 may be controlled by switches. FIG. 6 is a diagram illustrating a data driving IC 600 according to an exemplary embodiment of the disclosure. With reference to FIG. 6, instead of direct connection through conductive traces or wires, the data driving IC 600 includes a first switch 601 coupled between the first power terminal 120 and the first dummy terminal 140 and a second switch 602 coupled between the second power terminal 130 and the second dummy terminal 150. The first switch 601 and the second switch 602 may be implemented as transistors. The data driving IC 600 further includes a controller 650 configured to turn on or off of the first and second switches 601, 602, so as to couple the first power terminal 120 to the first dummy terminal 140 and couple the second power terminal 130 to the second dummy terminal 150.

Figure 7:
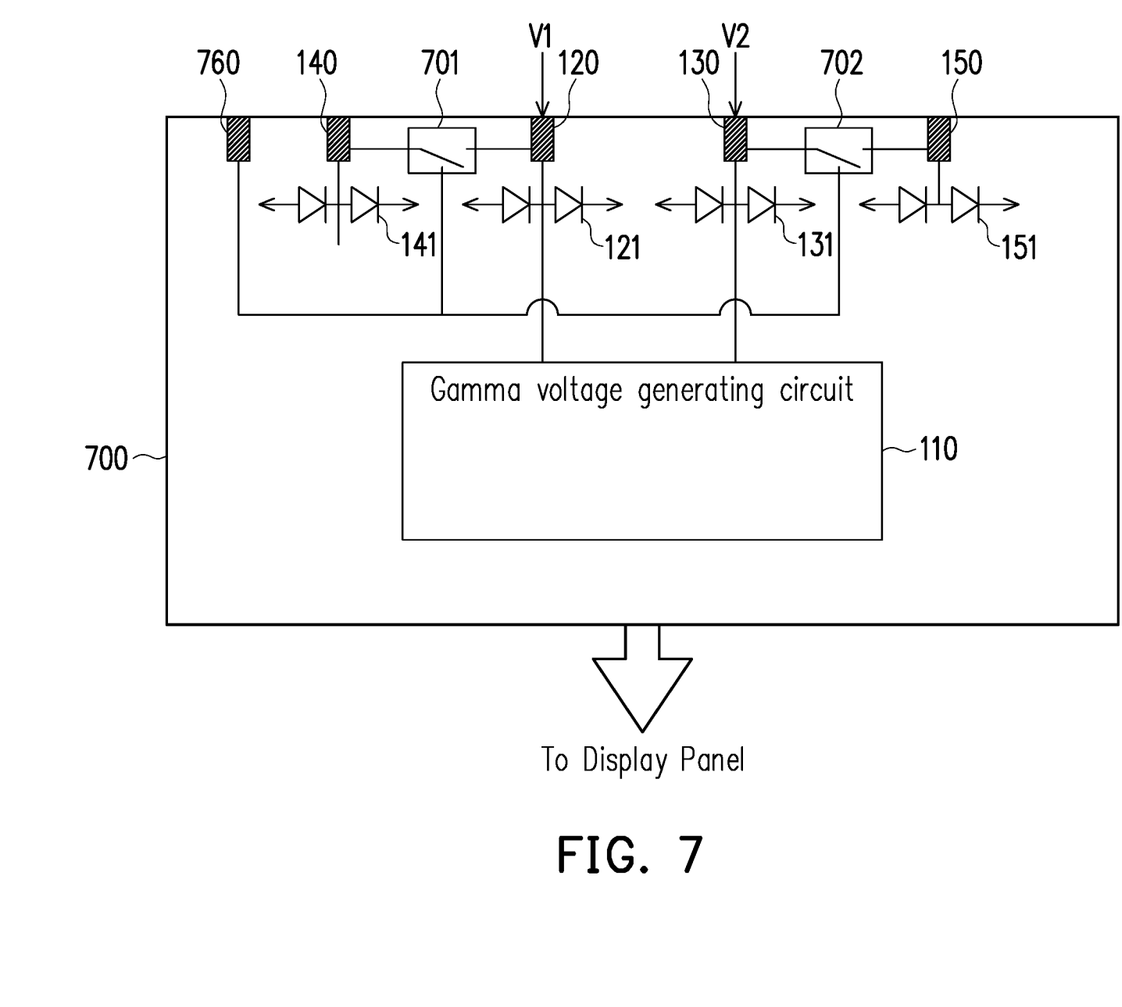
FIG. 7 is a diagram illustrating a data driving IC according to an exemplary embodiment of the disclosure.

FIG. 7 is a diagram illustrating a data driving IC 700 according to an exemplary embodiment of the disclosure. In the exemplary embodiment, the first and second switches 701, 702 illustrated in FIG. 7 are implemented by using transistors. The data driving IC 700 further includes a control terminal 760 receiving a control signal to turn on or off the first and second switches 701, 702 such that the connection between power terminals for receiving gamma reference voltages and dummy terminals can be controlled by an external circuit.

Figure 8:
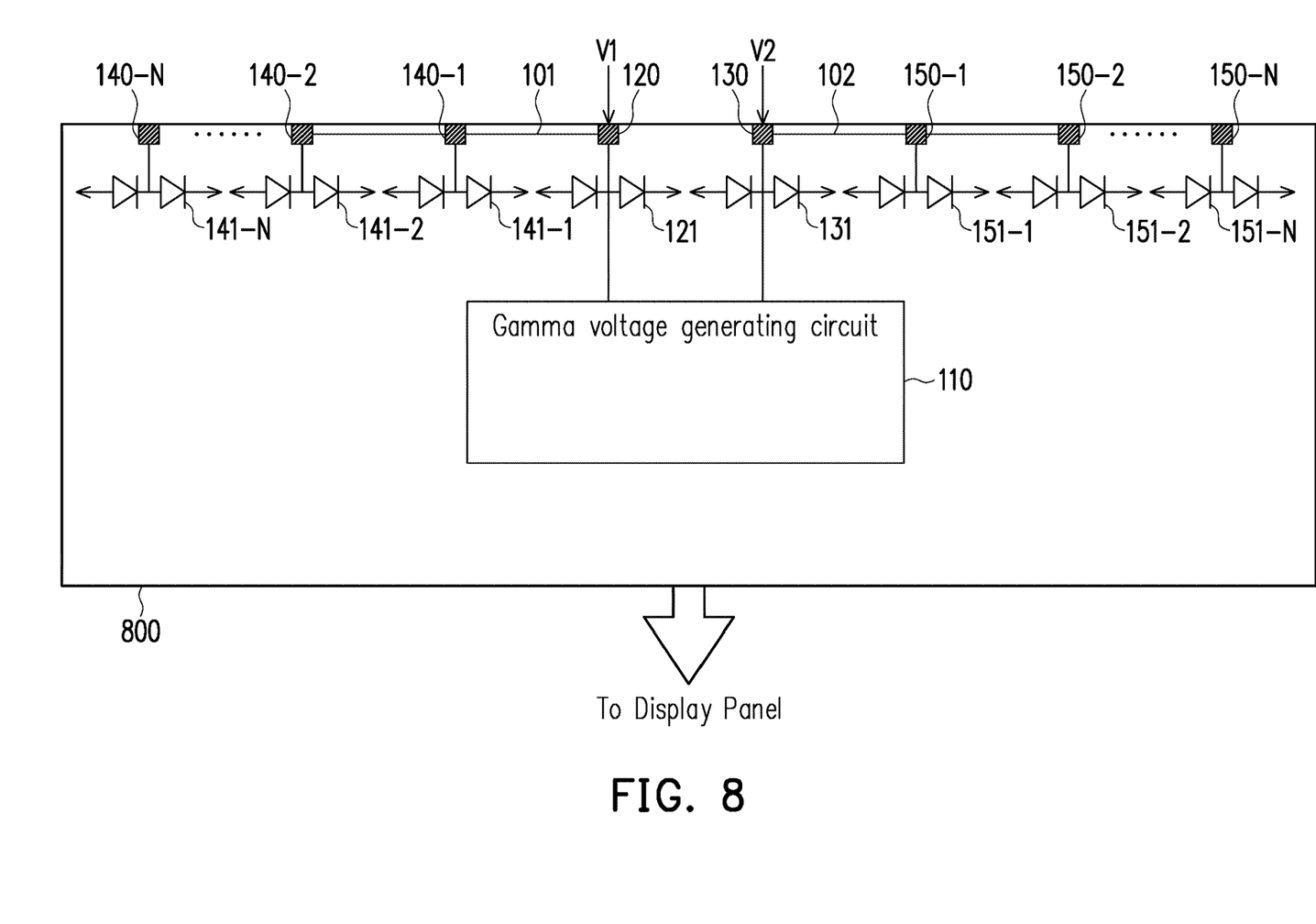
FIG. 8 is a diagram illustrating a data driving IC according to an exemplary embodiment of the disclosure.

In the disclosure, there are a plurality of I/O pins reserved for the gamma voltage generating circuit. FIG. 8 is a diagram illustrating a data driving IC according to an exemplary embodiment of the disclosure. With reference to FIG. 8, the data driving IC 800 includes a plurality of first dummy terminals 140-1 thru 140-N and a plurality of second dummy terminals 150-1 thru 150-N. Each of the first and second dummy terminals 140-1 thru 140-N, 150-1 thru 150-N are coupled to a corresponding ESD protection circuit 141-1 thru 141-N, 151-1 thru 151-N. In the exemplary embodiment, a plurality of first dummy terminals 140-1, 140-2 . . . 140-N may be coupled to the first power terminal 120 through any of the connections described above, so that the ESD protection circuit 121 and the ESD protection circuits 141-1 thru 141-N may be coupled each other in parallel for further decreasing the equivalent impedance of the ESD protection circuit at the first power terminal 120. Similarly, a plurality of second dummy terminals 150-1, 150-2 . . . 150-N may be coupled to the second power terminal 130 through any of the connections described above, so that the ESD protection circuit 131 and the ESD protection circuits 151-1 thru 151-N may be coupled to each other in parallel for further decreasing the equivalent impedance of the ESD protection circuit at the second power terminal 130.

In the exemplary embodiments of the disclosure, the first power terminal, the second power terminal, the first dummy terminals and the second dummy terminals are input/output pins or contact pads on the data driving integrated circuit. These I/O pins are configured to connect to and communicate with an external circuit.

In the disclosure, the described data driving IC is structurally configured to decrease the DC offset in the received gamma reference voltages which is cause by the radio frequency interference. The ESD protection circuits coupled to the dummy terminals (unused terminals) are utilized to create a parallel connection with the ESD protection circuit of the power terminal, so as to decrease the equivalent impedance of the ESD protection circuit at the power terminal coupled to the dummy terminals. Such decreases the DC offset, and thus improves the images displayed on the display apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed:

1. A data driving integrated circuit, comprising:
   a gamma voltage generating circuit, configured to receive a first voltage and a second voltage, wherein the first voltage and the second voltage are in a gamma voltage range, or are as the largest and the smallest gamma voltages of the gamma voltage range;
   a first power terminal, configured to receive the first voltage as a first gamma reference voltage;
   a first ESD protection circuit associated with the first power terminal, wherein
   the first ESD protection circuit is disposed in a path connecting between the first power terminal and the gamma voltage generating circuit;
   a second power terminal, configured to receive the second voltage as a second gamma reference voltage;
   a first dummy terminal, configured to receive a third gamma reference voltage other than the first voltage and the second voltage, wherein
   a DC offset included in the first gamma reference voltage received by the first power terminal is reduced by turning on a first switch disposed between the first dummy terminal and the first power terminal to directly connect the first dummy terminal with the first power terminal; and
   second ESD protection circuit associated with the first dummy terminal; wherein
   the first ESD protection circuit and the second ESD protection circuit are coupled in parallel.

2. The data driving integrated circuit of claim 1, wherein the first power terminal, the second power terminal and the first dummy terminal are input/output pins on the data driving integrated circuit and configured to connect to and communicate with an external circuit.

3. The data driving integrated circuit of claim 1, further comprising:
   a second dummy terminal, coupled to the second power terminal;
   a third ESD protection circuit associated with the second power terminal; and
   a fourth ESD protection circuit associated with the second dummy terminal,
   wherein the third ESD protection circuit and the fourth ESD protection circuit are coupled in parallel.

4. The data driving integrated circuit of claim 1, wherein the gamma voltage generation circuit comprises one or more voltage dividing circuits for generating a plurality of gamma voltages based on the first voltage and the second voltage.

5. The data driving integrated circuit of claim 3, further comprising:
   a second switch, coupled between the second power terminal and the second dummy terminal.

6. The data driving integrated circuit of claim 5, further comprising:
   a controller, configured to turn on or off the first switch connecting the first power terminal with the first dummy terminal, and configured to turn on or off the second switch connecting the second power terminal with the second dummy terminal.

7. The data driving integrated circuit of claim 5, further comprising a control terminal, receiving a control signal from an external controller, wherein the control signal is configured to turn on or off the first and second switches.

8. A display apparatus, comprising:
   a display panel, comprising a plurality of pixels, wherein each pixel is driven according to a data voltage;
   a data driving integrated circuit, disposed on a substrate which is a part of the display panel, for providing data voltages to drive the pixels, and
   the data driving integrated circuit comprising:
   a gamma voltage generating circuit, configured to receive a first voltage and a second voltage, wherein the first voltage and the second voltage are in a gamma voltage range, or are as the largest and the smallest gamma voltages of the gamma voltage range;
   a first power terminal, configured to receive the first voltage as a first gamma reference voltage;
   a first ESD protection circuit associated with the first power terminal, wherein
   the first ESD protection circuit is disposed in a path connecting between the first power terminal and the gamma voltage generating circuit;
   a second power terminal, configured to receive the second voltage as a second gamma reference voltage;
   a first dummy terminal, configured to receive a third gamma reference voltage other than the first voltage and the second voltage, wherein
   a DC offset included in the first gamma reference voltage received by the first power terminal is reduced by turning on a first switch disposed between the first dummy terminal and the first power terminal to directly connect the first dummy terminal with the first power terminal; and
   a second ESD protection circuit associated with the first dummy terminal;
   wherein the first ESD protection circuit and the second ESD protection circuit are coupled in parallel,
   a power supplying circuit, disposed on a mainboard, and configured to generate the first voltage and the second voltage; and
   a connecting device connecting the mainboard and the data driving integrated circuit, wherein
   the first voltage and the second voltage are transmitted to the data driving integrated circuit through the connecting device.

9. The display apparatus of claim 8, wherein the data driving integrated circuit further comprising:

a second dummy terminal, coupled to the second power terminal;

a third ESD protection circuit associated with the second power terminal; and a fourth ESD protection circuit associated with the second dummy terminal, wherein the third ESD protection circuit and the fourth ESD protection circuit are coupled in parallel.

10. The display apparatus of claim 8, wherein the gamma voltage generation circuit comprises one or more voltage dividing circuits for generating a plurality of gamma voltages based on the first voltage and the second voltage.

11. The display apparatus of claim 9, wherein the data driving integrated circuit further comprising:

a second switch, coupled between the second power terminal and the second dummy terminal.

12. The display apparatus of claim 11, wherein the data driving integrated circuit further comprising:

a controller, configured to turn on or off the first switch connecting the first power terminal with the first dummy terminal, and configured to turn on or off the second switch connecting the second power terminal with the second dummy terminal.

13. The display apparatus of claim 11, further comprising:

a controller, coupled to the gamma voltage generating circuit, and configured to generate a control signal, wherein the gamma voltage generating circuit, further comprises a control terminal, receiving the control signal from the controller, wherein the control signal is configured to turn on or off the first and second switches.

* * * * *